United States Patent [19]

Killion et al.

[11] Patent Number: 5,661,420

[45] Date of Patent: Aug. 26, 1997

[54] MOUNTING CONFIGURATION FOR MONOLITHIC INTEGRATED CIRCUIT

[75] Inventors: Mead Killion, Elk Grove Village; Jonathan K. Stewart, Bensenville, both of Ill.

[73] Assignee: Etymotic Research, Inc., Elk Grove Village, Ill.

[21] Appl. No.: 409,798

[22] Filed: Mar. 23, 1995

Related U.S. Application Data

[63] Continuation-in-part of Ser. No. 400,876, Mar. 8, 1995, Pat. No. 5,623,550.

[51] Int. Cl.$^6$ ................................................. G01R 19/00
[52] U.S. Cl. .................. 327/29; 381/69.2; 361/760; 361/811
[58] Field of Search .......................... 327/29; 361/760, 361/766, 782, 811; 381/69, 69.2

[56] References Cited

U.S. PATENT DOCUMENTS

| | | | |
|---|---|---|---|
| 3,490,055 | 1/1970 | Cox | 361/766 |
| 4,423,456 | 12/1983 | Zaidenweber | 361/77 |
| 5,210,804 | 5/1993 | Schmid | 381/69.2 |
| 5,309,324 | 5/1994 | Herandez et al. | 361/811 |
| 5,367,430 | 11/1994 | Devoe et al. | 361/328 |
| 5,375,035 | 12/1994 | Stoddard | 361/782 |
| 5,379,189 | 1/1995 | Merriman | 361/760 |
| 5,402,321 | 3/1995 | Izu et al. | 361/811 |

*Primary Examiner*—Timothy P. Callahan
*Assistant Examiner*—Jung Ho Kim
*Attorney, Agent, or Firm*—McAndrews, Held & Malloy, Ltd.

[57] ABSTRACT

A power supply circuit is set forth which overcomes the problems associated with incorrect battery insertion. The power supply circuit includes first and second battery terminals for electrical connection to the battery. The first and second battery terminals are connected to a first transistor switching circuit. The first transistor switching circuit is responsive to power from the battery to through-connect a negative polarity power signal therethrough irrespective of the polarity orientation of the battery. The first and second battery terminals are also connected to a second transistor switching circuit. The second switching circuit is responsive to power from the battery to through-connect a positive polarity power signal therethrough irrespective of polarity orientation of the battery. The negative and positive polarity power signals are available for connection to a load device, such as a hearing aid amplifier. The device is thereby provided with proper power polarity irrespective of the way in which the battery is inserted between the first and second battery terminals. The power supply circuit is implemented in an integrated circuit format and is mounted with a chip capacitor.

7 Claims, 8 Drawing Sheets

MOUNTING CONFIGURATION FOR MONOLITHIC INTEGRATED CIRCUIT

CROSS-REFERENCE TO RELATED APPLICATIONS

This application is a continuation-in-part of U.S. Ser. No. 08/400,876, filed Mar. 8. 1995 (Attorney Docket No. 10771US01), U.S. Pat. No. 5,623,550, entitled "BATTERY POWER SUPPLY CIRCUIT WHICH SUPPLIES CORRECT POWER POLARITY IRRESPECTIVE OF BATTERY ORIENTATION".

TECHNICAL FIELD

The present invention relates generally to the field of power supplies. More particularly, the present invention relates to a mounting configuration for a battery power supply circuit that supplies correct power polarity to a load device irrespective of the orientation of the battery.

BACKGROUND

Devices which use batteries as a source of power are well known. Such devices include, but are not limited to, portable radios, portable communications devices, and medical devices such as hearing aids.

Most devices that use batteries as a power source provide an access panel or the like which allows the user to install or replace the batteries. Such access by the user increases the possibility for human errors. One type of human error that is frequently encountered is a battery polarity error. A battery polarity error occurs when the user inserts the battery in the device with a reversed polarity. As a result of the error, the positive terminal of the battery is connected to the negative power terminal of the device and the negative terminal of the battery is connected to the positive terminal of the device. With the battery connected to the device with a reversed polarity, the device will generally not work or, in some instances, may be damaged. Even in the absence of permanent damage, a polarity error can be a source of frustration to the user, particularly when the battery is a disc-type battery, such as the type used in a hearing aid, since it is often difficult for the ordinary user to discern between the positive and negative terminals on such batteries. As such, it may be difficult for the user to perform the initial installation correctly and to subsequently diagnose the polarity insertion error. Additionally, mechanical damage to a hearing aid may be caused by reverse insertion of the battery resulting in the return of the hearing aid to the manufacturer for repair.

SUMMARY OF THE INVENTION

A power supply circuit is set forth which overcomes the problems associated with incorrect battery insertion. The power supply circuit includes first and second battery terminals for electrical connection to the battery. The first and second battery terminals are connected to a first transistor switching circuit. The first transistor switching circuit is responsive to power from the battery to through-connect a negative polarity power signal therethrough irrespective of the polarity orientation of the battery. The first and second battery terminals are also connected to a second transistor switching circuit. The second switching circuit is responsive to power from the battery to through-connect a positive polarity power signal therethrough irrespective of polarity orientation of the battery. The negative and positive polarity power signals are available for connection to a load device, such as a hearing aid. The device is thereby provided with proper power polarity irrespective of the way in which the battery is inserted between the first and second battery terminals.

In accordance with one embodiment, the power supply circuit is provided in an efficient and compact mounting configuration. A chip capacitor is utilized in the configuration. The chip capacitor has a planar side and further includes first and second capacitor terminals formed from first and second metallized portions on the planar side. The power supply circuit is formed as a planar monolithic circuit having first and second terminals for receiving DC power and third and fourth terminals for supplying DC power of a constant polarity irrespective of polarity of the DC power received at the first and second terminals. The power supply circuit is mounted to the planar side of the chip capacitor and the first and second terminals of the power supply circuit are respectively connected to the first and second metallized portions on the planar side of the chip capacitor. Third and fourth metallized portions may be disposed on the planar side of the chip capacitor and connected to the third and fourth terminals of the power supply circuit.

In accordance with further features of the mounting configuration, the chip capacitor further comprises a further planar side disposed generally parallel to the planar side. The first, second, third, and fourth metallized portions extend to the further planar side. The first and second metallized portions are formed as visual indicia indicating that power supply connections thereto are not polarity sensitive while the third and fourth metallized portions are formed as visual indicia respectively indicating which power polarity is available thereat.

Other objects and advantages of the present invention will become apparent upon reference to the accompanying detailed description when taken in conjunction with the following drawings.

DETAILED DESCRIPTION OF THE PREFERRED EMBODIMENT

Figure 1:
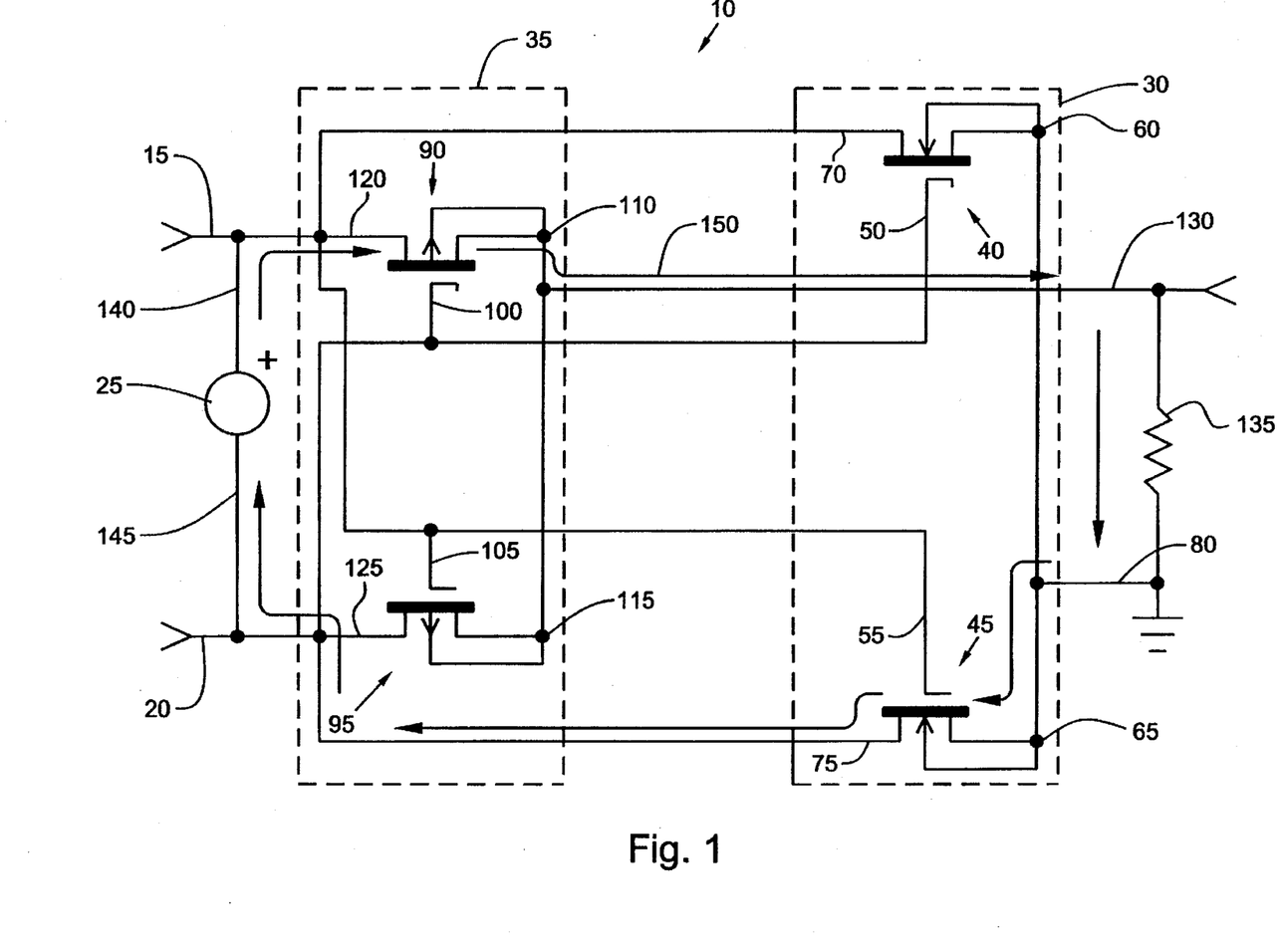
FIG. 1 is a schematic diagram of one embodiment of a power supply circuit for use in supplying power of constant polarity from a battery to a load irrespective of the polarity orientation of the battery.

A power supply circuit 10 constructed in accordance with one embodiment of the present invention is illustrated in FIG. 1. As illustrated, the power supply circuit 10 includes a first terminal 15 and a second terminal 20 that are connected to a battery 25. Terminals 15 and 20 supply battery power to a first transistor switching circuit 30 and a second transistor switching circuit 35.

The first transistor switching circuit 30 includes first and second n-channel MOSFETs 40 and 45, each having a gate terminal 50, 55, a source terminal 60, 65, and a drain terminal 70, 75' respectively, and which operate, for example, in enhancement mode. The gate terminal 50 of first n-channel MOSFET 40 is connected to the second battery terminal 20. The drain terminal 70 of first n-channel MOSFET 40 is connected to the first battery terminal 15. The gate terminal 55 of the second n-channel MOSFET 45 is connected to the first battery terminal 15 while the drain terminal 75 is connected to the second battery terminal 20. The sources 60 and 65 of the first and second n-channel MOSFETS 40, 45 are connected together and supply a negative polarity power signal at line 80.

The second transistor switching circuit 35 includes first and second p-channel MOSFETs 90 and 95, each having a gate terminal 100, 105, a source terminal 110, 115, and a drain terminal 120, 125, respectively, and which operate, for example, in enhancement mode. The gate terminal 100 of first p-channel MOSFET 90 is connected to the second battery terminal 20. The drain terminal 120 of first p-channel MOSFET 90 is connected to the first battery terminal 15. The gate terminal 105 of the second p-channel MOSFET 95 is connected to the first battery terminal 15 while the drain terminal 125 is connected to the second battery terminal 20. The sources 110 and 115 of the first and second p-channel MOSFET 90, 95 are connected together and supply a positive polarity power signal at line 130.

In operation, the first transistor switching circuit through-connects the negative polarity terminal of the battery 25 to terminal 80 for supply to a load 135 irrespective of the polarity of the battery 25 between battery terminals 15 and 20. Similarly, the second transistor switching circuit 35 through-connects the positive polarity terminal of the battery 25 to terminal 130 for supply to the load 135 irrespective of the polarity of the battery 25 between terminals 15 and 20.

Operation of the circuit 10 can be illustrated with reference to FIGS. 1 and 2 which show connection of the battery to terminals 15 and 20 with two different polarity orientations. In FIG. 1, the battery 25 has its positive terminal 140 connected to the first battery terminal 15 and its negative battery terminal 145 connected to the second battery terminal 20. In this orientation, the battery supplies control voltages to the gate terminals 50, 55, 100 and 105 of the MOSFETs 40, 45, 90, and 95. The control voltages cause first p-channel MOSFET 90 and second n-channel MOSFET 45 to go to a conductive state while causing second p-channel MOSFET 95 and first n-channel MOSFET 40 to go to a non-conductive state. As such, MOSFET 90 through-connects the power at the positive terminal 140 of the battery 25 to line 130 to supply the positive polarity power signal at line 130 to the load 135. Similarly, MOSFET 45 through-connects the power at negative terminal 145 of the battery 25 to line 80 to supply the negative polarity power signal at line 80 to the load 135. The MOSFETs 45 and 90 thus provide a current path therethrough illustrated by arrow 150.

Figure 2:
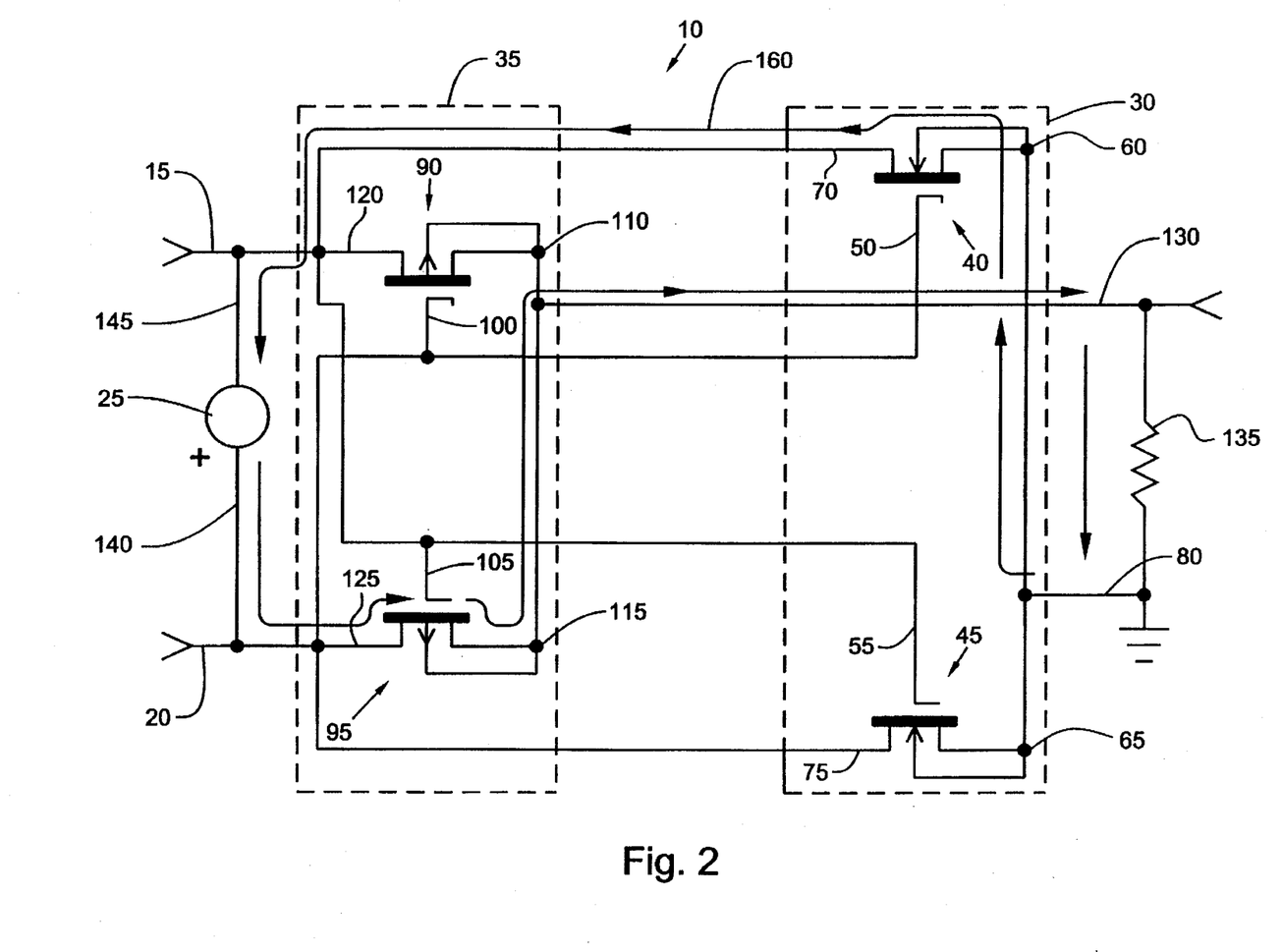
FIG. 2 is a schematic diagram of the circuit of FIG. 1 illustrating current flow through the circuit when the battery is in a polarity orientation differing from the one shown in FIG. 1.

In FIG. 2, the battery 25 has its positive terminal 140 connected to the second battery terminal 20 and its negative battery terminal 145 connected to the first battery terminal 15. In this orientation, the battery 25 supplies control voltages to the gate terminals 50, 55, 100 and 105 of the MOSFETs 40, 45, 90, and 95 which are opposite those supplied in connection with the battery orientation illustrated in FIG. 1. The control voltages supplied in FIG. 2 cause second p-channel MOSFET 95 and first n-channel MOSFET 40 to go to a conductive state while causing first p-channel MOSFET 90 and second n-channel MOSFET 45 to go to a non-conductive state. As such, MOSFET 95 through-connects the power at the positive terminal 140 of the battery 25 to line 130 to supply the positive polarity power signal to the load 135. Similarly, MOSFET 40 through-connects the power at negative terminal 145 of the battery 25 to line 80 to supply the negative polarity power signal to the load 135. The MOSFETs 40 and 95 thus provide a current path therethrough illustrated by arrow 160.

Figure 3:
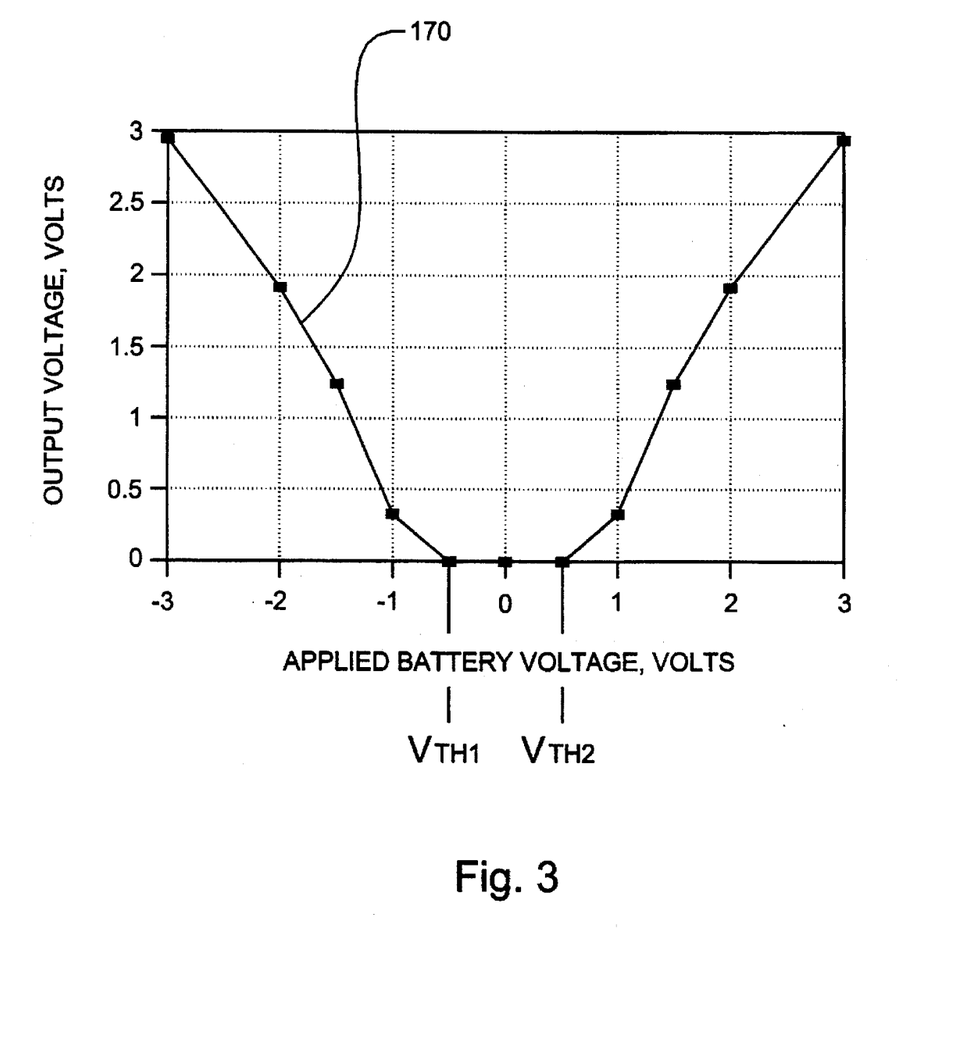
FIG. 3 is an exemplary graph of output voltage versus battery input voltage at the battery input terminals for the circuit of FIG. 1.

FIG. 3 is a graph illustrating the voltage at output lines 130 and 80 versus the battery voltage supplied across battery terminals 15 and 20. As illustrated, the output voltage, illustrated by line 170, generally tracks the magnitude of the battery voltage for battery voltages below a first threshold voltage $V_{TH1}$. The output voltage, however, is of opposite polarity for battery voltages below $V_{TH1}$. The circuit 10 does not conduct battery power to the output lines 130 and 80 for voltages between the first threshold voltage $V_{TH1}$ and a second threshold voltage $V_{TH2}$. For voltages greater than $V_{TH2}$, the output voltage generally tracks both the polarity and magnitude of the battery voltage. The nonconductive range between $V_{TH1}$ and $V_{TH2}$ can be minimized by employing MOSFETs having very low threshold voltages. Additionally, the output voltage will more closely track the input voltage from the battery where MOSFETs having low source to drain resistances are employed.

As can be recognized by those skilled in the art, the power supply circuit 10 can function as a transistor rectifier circuit which is relatively lossless compared to diode rectifier circuits, particularly when the threshold voltages of the MOSFETs and the source to drain resistances of the MOSFETs are made to be very low.

Figure 4:
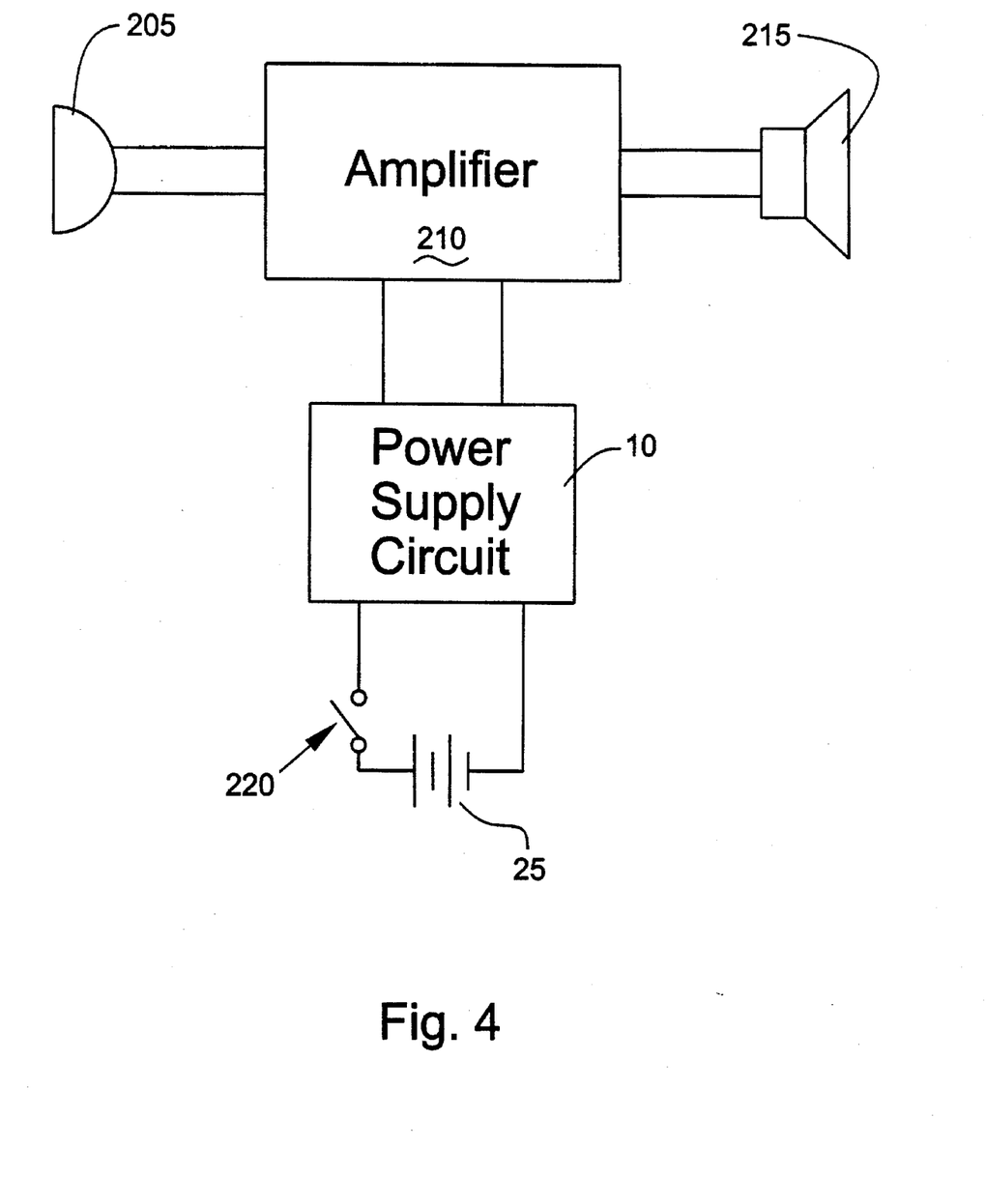
FIG. 4 is a schematic block diagram of a hearing aid employing the circuit of FIG. 1.

FIG. 4 illustrates one embodiment of a hearing aid 200 employing the power supply circuit 10. The power supply circuit 10 is particularly well suited for use in the hearing aid since most hearing aids receive their power from low-voltage (about 1.3 VDC) disc-type batteries. Hearing aid users often find it difficult to properly orient the battery with the correct polarity in the hearing aid 200. Therefore, the hearing aid user benefits from the hearing aid 200 being operable irrespective of the battery polarity orientation. Additionally, the power supply circuit 10, being constructed from FETs having limited drain to source resistances as well as requiring minimal control current and gate voltages, is relatively lossless making it particularly well suited to the low voltage operation of the hearing aid 200.

As illustrated, the hearing aid 200 includes a microphone 205, an amplifier 210, a receiver 215, a battery 25 and the power supply circuit 10. The microphone 205 operates to transduce sound waves to electrical signals which are subsequently amplified by the amplifier 210. The amplifier output is supplied to the receiver 215 which transduces the electrical signals output from the amplifier 210 to sound waves which may be heard by the user. The amplifier 210 receives power from the battery 25 through an on/off switch 220 and the power supply circuit 10. The microphone 205 may receive power from the amplifier. As will be readily recognized by those skilled in the art, the amplifier 210 may include various filter and amplification circuitry which tailors the amplifier response output to the particular hearing loss of the user.

Figure 5:
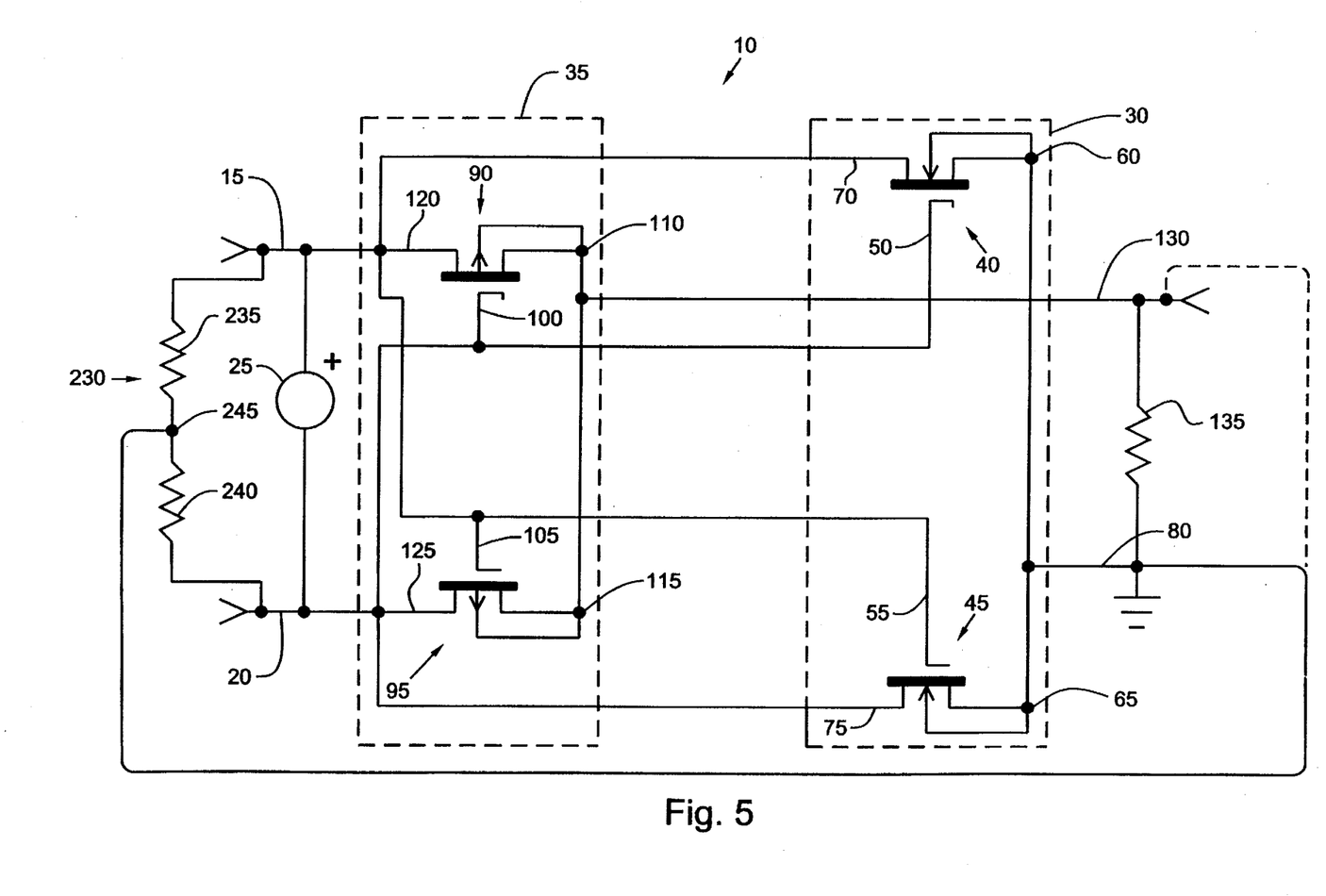
FIG. 5 is a schematic diagram of the power supply circuit of FIG. 1 with a voltage divider circuit that may assist in ensuring proper start-up operation.

FIG. 5 illustrates a further embodiment of the power supply circuit 10 which includes a voltage divider circuit 230 that may assist in ensuring proper start-up operation. The voltage divider circuit 230 is connected between terminals 15 and 20 and includes resistors 235 and 240. The resistors 235 and 240 may, for example, each have a resistance of 100K. The voltage divider circuit 230 includes a central node 245 that is connected to the negative power polarity signal at line 80. Alternatively, node 245 may be connected to the positive power polarity signal at line 130.

Although the MOSFETs 40, 45, 90, 95 of the circuit 10 are illustrated as operating in enhancement mode, a similar configuration can be implemented using depletion mode MOSFETs. In such instance, the cut-off voltages of the depletion mode MOSFETs should be greater than the minimum battery voltage at which the load device must operate.

As previously noted, the power supply circuit 10 may be easily implemented in a monolithic integrated circuit format. When the power supply circuit 10 is implemented in this fashion, it may be mounted in the manner shown in FIGS. 6 and 7. As illustrated, a circuit, shown generally at 300, includes the power supply integrated circuit 310 and a chip capacitor 320. The chip capacitor 320 may be constructed, for example, in the manner set forth in U.S. Pat. No. 5,367,430, and which is commercially available from Presidio Components, Inc. of California. The chip capacitor 320 includes a first planar side 325 and a second planar side 330. A plurality of metallized portions 335, 340, 345, and 350 are disposed on the first planar side 325 and extend around the edges of the capacitor 320 to the second planar side 330.

Figure 6:
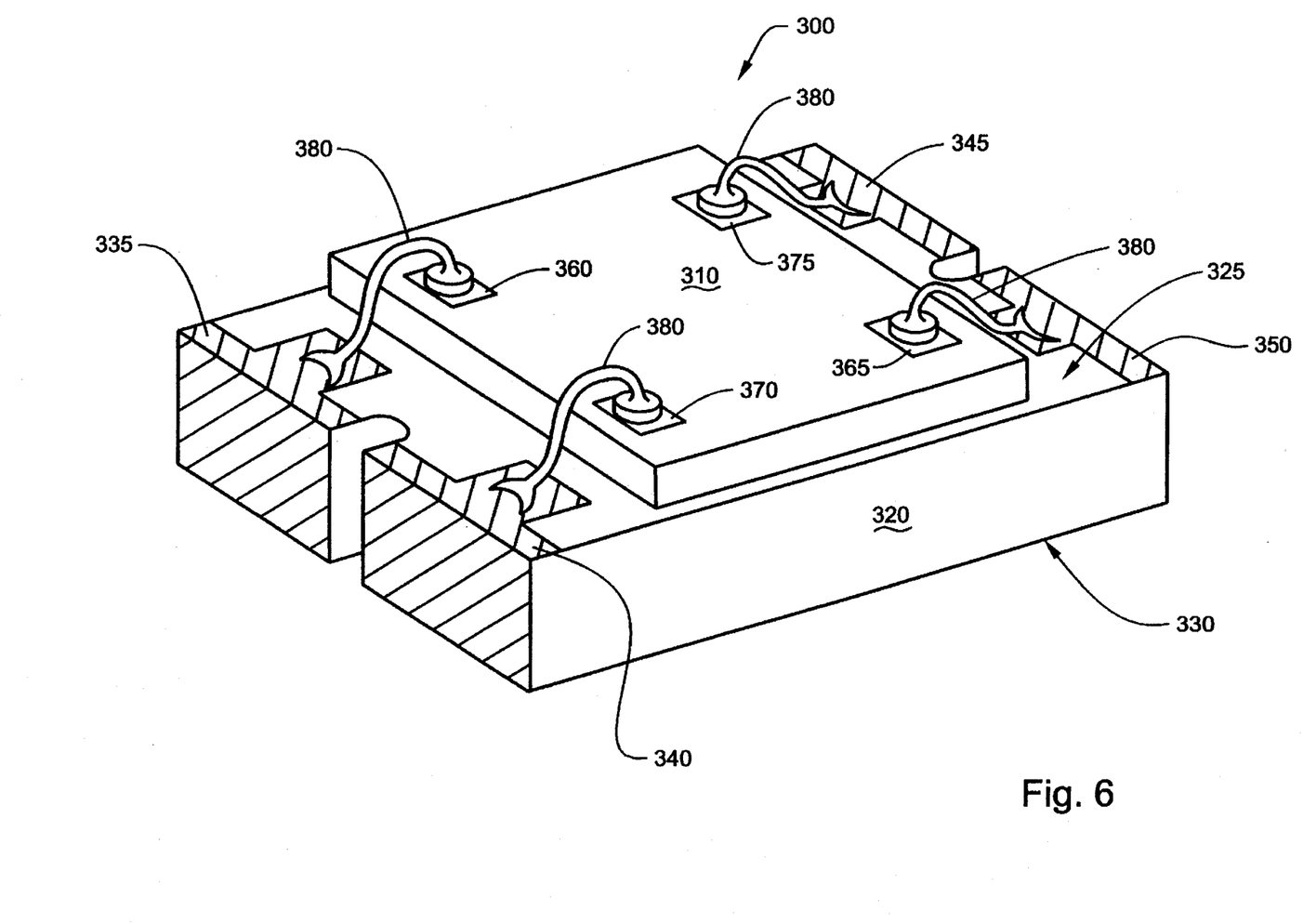
FIGS. 6–8 are perspective views of the power supply circuit mounted to a chip capacitor where the power supply circuit is implemented as a monolithic integrated circuit.

The power supply integrated circuit 310 may be constructed by implementing the circuit of FIG. 1 in a monolithic format using known fabrication techniques. The integrated circuit includes metallized pads 360 and 365 corresponding to battery supply inputs 15 and 20, and metallized pads 370 and 375 corresponding to output lines 80 and 130, respectively. Metallized pads 360, 365, 370, and 375 are connected respectively to the first, second, third, and fourth metallized portions 335, 340, 345, and 350 by respective wires 380 using, for example, known wire bonding techniques. A known nonconducting adhesive may further be used to assure mechanical stability of the mounting between the power supply integrated circuit 310 and the chip capacitor.

Figure 7:
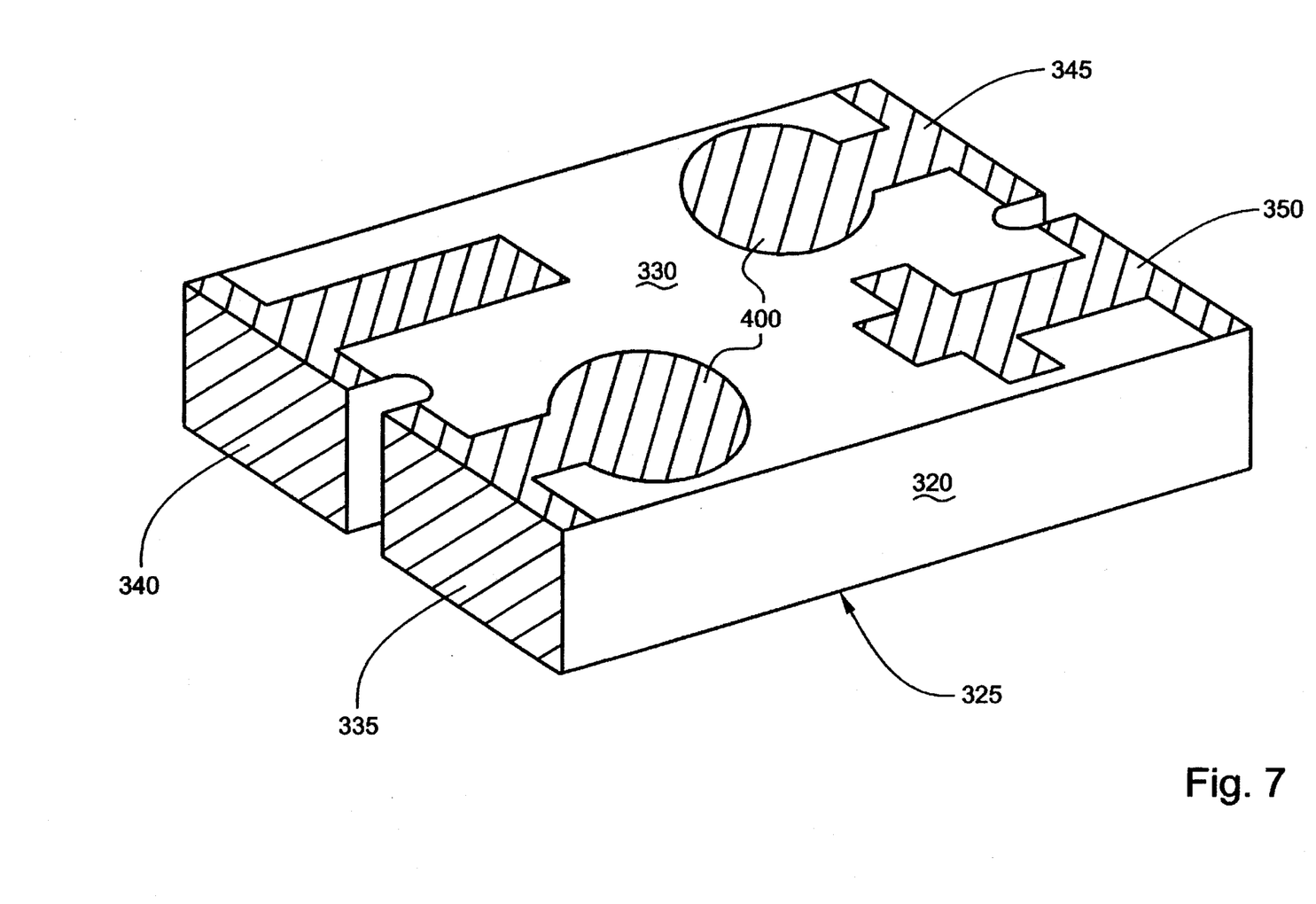

FIG. 7 illustrates the metallization on the second planar side 330 of the chip capacitor 320. As shown, metallized portions 335 and 350 that are electrically connected to the battery inputs 15 and 20 of the circuit of FIG. 1 have rounded end terminals 400. The round end terminals 400 provide the assembler with a visual indication that there is no particular polarity associated with these outputs. Similarly, metallized portions 340 and 350 that are connected to the outputs 80 and 130 provide the assembler with a visual indication of the power polarity available thereat. Here, metallized portion 350 carries the positive power polarity output as indicated by the "plus sign" shape of the metallization while metallized portion 340 carries the negative power polarity output as indicated by the "negative sign" shape of the metallization. Metallization layers 335 and 345 also provide electrical connection to the chip capacitor 320 that may, for example, have a capacitance value of 2.2 uF. Capacitor 320 is nonpolar in the illustrated embodiment.

Figure 8:
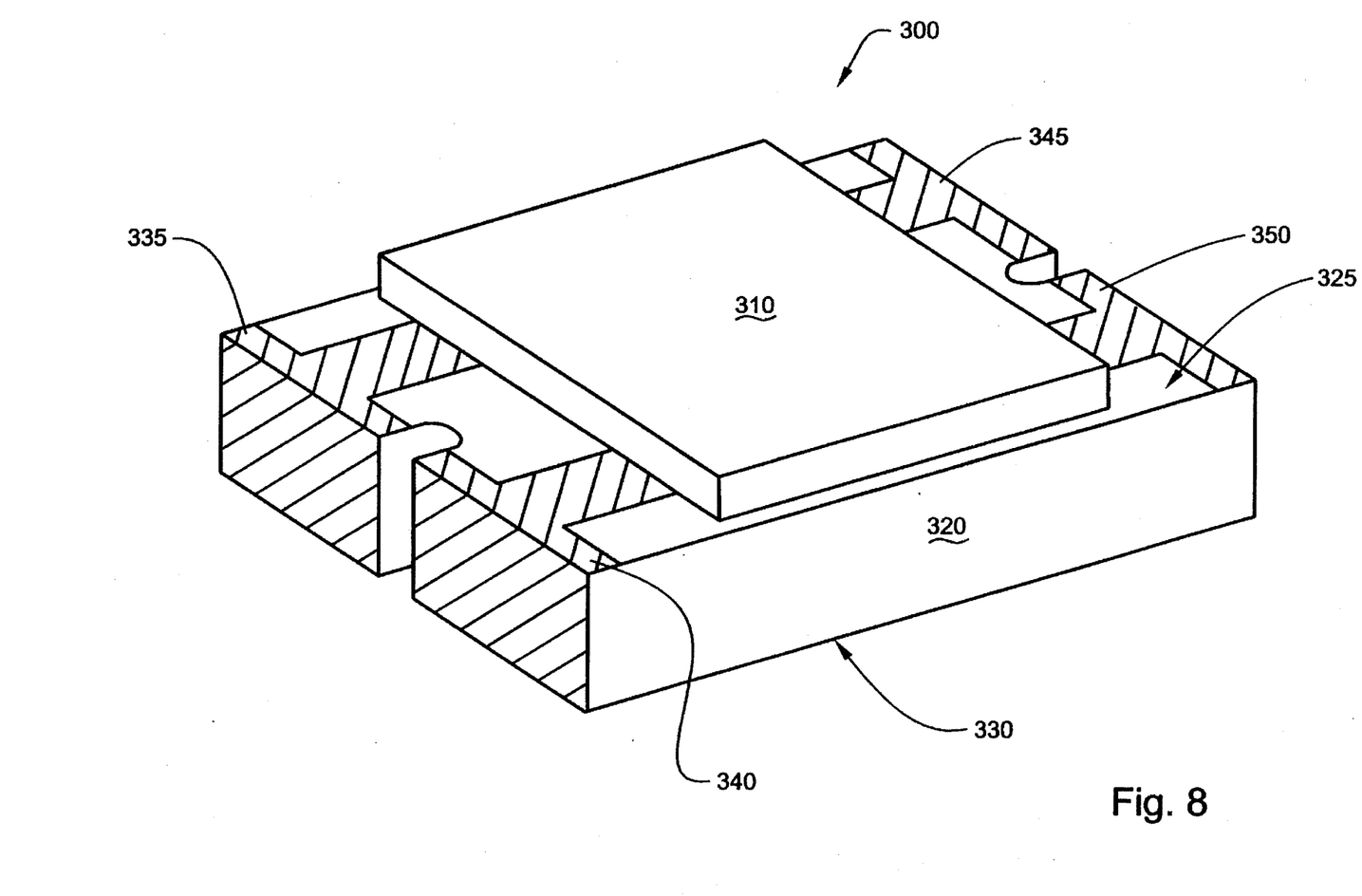

FIG. 8 is a further embodiment of a circuit which uses an alternative connection technology to the wire bonding of the embodiment of FIG. 6. In the embodiment of FIG. 8, the power supply integrated circuit 310 is mounted, connection side down, to the planar side 325 of the chip capacitor 320. Connections between the pads 360, 365, 370, and 375 (not shown in FIG. 8 since the connections are on the side of the circuit adjacent planar surface 325) and the corresponding metallized portions may be made using, for example, the C$^4$™ technology used by IBM Corporation. A known non-conducting adhesive may further be used to assure mechanical stability of the mounting between the power supply integrated circuit 310 and the chip capacitor.

When the power supply circuit 10 is utilized in a hearing aid, it is often necessary to provide a capacitor across the battery terminal inputs to reduce noise spikes caused by class D amplifiers typically used in such devices. The embodiments of FIGS. 6–8 are particularly advantageous for such devices since the embodiments provide both the power supply circuit 10 and the requisite capacitor in a single circuit unit which requires a minimal amount of space.

Although the present invention has been described with reference to a specific embodiment, those of skill in the art will recognize that changes may be made thereto without departing from the scope and spirit of the invention as set forth in the appended claims.

We claim as our invention:

1. A circuit comprising:

a) a chip capacitor having a planar side, the chip capacitor further having first and second capacitor terminals formed from first and second metallized sections on the planar side; and b) a power supply circuit having first and second terminals for receiving DC power and third and fourth terminals for supplying DC power of a constant polarity irrespective of polarity of the DC power received at the first and second terminals, the power supply circuit being implemented as a planar monolithic circuit and mounted to the planar side of the chip capacitor, the first and second terminals of the power supply circuit being respectively connected to the first and second metallized portions on the planar side of the chip capacitor.

2. A circuit as claimed in claim 1 and further comprising third and fourth metallized portions disposed on the first planar side of the chip capacitor, the third and fourth terminals of the power supply circuit being respectively connected to the third and fourth metallized portions.

3. A circuit as claimed in claim 2 wherein the first and third metallized portions are disposed along a first side of the chip capacitor.

4. A circuit as claimed in claim 3 wherein the second and fourth metallized portions are disposed along a second side of the chip capacitor.

5. A circuit as claimed in claim 2 wherein the chip capacitor further comprises a further planar side disposed generally parallel to the planar side, the first, second, third, and fourth metallized portions extending to the further planar side.

6. A circuit as claimed in claim 5 wherein the first and second metallized portions are formed as visual indicia indicating that power supply connections thereto are not polarity sensitive.

7. A circuit as claimed in claim 6 wherein the third and fourth metallized portions are formed as visual indicia respectively indicating which power polarity is available thereat.

* * * * *